(12) United States Patent
Shyshkin

(10) Patent No.: US 11,917,309 B2
(45) Date of Patent: *Feb. 27, 2024

(54) PIXEL LOCATION CALIBRATION IMAGE CAPTURE AND PROCESSING

(71) Applicant: Ignis Innovation Inc., Waterloo (CA)

(72) Inventor: Vyacheslav Shyshkin, Kitchener (CA)

(73) Assignee: Ignis Innovation Inc., Road Town (VG)

( * ) Notice: Subject to any disclaimer, the term of this patent is extended or adjusted under 35 U.S.C. 154(b) by 0 days.

This patent is subject to a terminal disclaimer.

(21) Appl. No.: 18/184,343

(22) Filed: Mar. 15, 2023

(65) Prior Publication Data

US 2023/0224597 A1    Jul. 13, 2023

Related U.S. Application Data

(63) Continuation of application No. 16/999,184, filed on Aug. 21, 2020, now Pat. No. 11,637,973.

(60) Provisional application No. 62/891,090, filed on Aug. 23, 2019.

(51) Int. Cl.
| | |
|---|---|
| *H04N 25/40* | (2023.01) |
| *G06T 7/33* | (2017.01) |
| *G06T 7/73* | (2017.01) |
| *G06T 7/80* | (2017.01) |

(Continued)

(52) U.S. Cl.
CPC .............. *H04N 25/40* (2023.01); *G06T 7/33* (2017.01); *G06T 7/73* (2017.01); *G06T 7/80* (2017.01); *G09G 3/3233* (2013.01); *H01L 27/14609* (2013.01); *G06T 2207/10024* (2013.01); *G09G 2300/0842* (2013.01); *G09G 2320/0233* (2013.01); *G09G 2320/029* (2013.01); *G09G 2320/041* (2013.01); *G09G 2320/045* (2013.01);

(Continued)

(58) Field of Classification Search
CPC .. H04N 5/341; G06T 7/33; G06T 7/80; G06T 2207/10024; G06T 2207/20016; G06T 2207/30121; G06T 7/0004; H01L 27/14609

See application file for complete search history.

(56) References Cited

U.S. PATENT DOCUMENTS 6,535,307 B1 * 3/2003 Allen .................. H04N 1/6033
358/406
10,311,780 B2    6/2019 Chaji (Continued)

FOREIGN PATENT DOCUMENTS

| CA | 2889870 A1 | 11/2016 |
|---|---|---|
| CN | 1753061 A | 3/2006 |

OTHER PUBLICATIONS

Written Opinion dated Oct. 28, 2020 and ISR for corresponding application PCT/CA2020/051141.

(Continued)

*Primary Examiner* — Molly Wilburn
(74) *Attorney, Agent, or Firm* — Stratford Group Ltd.

(57) ABSTRACT

What is disclosed are systems and methods for optical correction for correcting for non-uniformity in active matrix light emitting diode device (AMOLED) and other emissive displays, using iterative processing of images of calibration patterns including features of coarse and fine granularity to successively generate a high-resolution estimate of the panel pixel locations.

20 Claims, 6 Drawing Sheets

(51) Int. Cl.
*G09G 3/3233* (2016.01)
*H01L 27/146* (2006.01)
(52) U.S. Cl.
CPC . *G09G 2320/0693* (2013.01); *G09G 2330/10* (2013.01)

(56) References Cited

U.S. PATENT DOCUMENTS

| | | | |
|---|---|---|---|
| 11,637,973 B2 * | 4/2023 | Shyshkin | G06T 7/80 382/194 |
| 2007/0035706 A1 * | 2/2007 | Margulis | H04N 9/3102 353/122 |
| 2007/0115440 A1 * | 5/2007 | Wiklof | H04N 9/3194 353/69 |
| 2012/0074851 A1 * | 3/2012 | Erinjippurath | G09G 3/20 315/158 |
| 2013/0050504 A1 * | 2/2013 | Safaee-Rad | G09G 5/02 348/181 |
| 2014/0225938 A1 * | 8/2014 | Soni | G09G 3/3233 345/690 |
| 2016/0301922 A1 * | 10/2016 | Green | H04N 17/002 |
| 2018/0144502 A1 * | 5/2018 | Wakai | G06T 7/75 |
| 2018/0366063 A1 | 12/2018 | Soni et al. | |
| 2019/0052872 A1 | 2/2019 | Shyshkin et al. | |

OTHER PUBLICATIONS

Office Action dated Mar. 7, 2023 for corresponding application CN 202080068938.0.

\* cited by examiner

PIXEL LOCATION CALIBRATION IMAGE CAPTURE AND PROCESSING

CROSS REFERENCE TO RELATED APPLICATIONS

This application is a continuation of U.S. patent application Ser. No. 16/999,184, filed Aug. 21, 2020, now allowed, which claims the benefit of U.S. Provisional Patent Application No. 62/891,090, each of which are hereby incorporated by reference in their entireties.

FIELD OF THE INVENTION

The present disclosure generally relates to optical measurement and calibration of light emissive visual display technology, and particularly to panel pixel location calibration for optical correction systems of active matrix organic light emitting diode device (AMOLED) and other emissive displays.

BRIEF SUMMARY

According to a first aspect there is provided an optical correction method for correcting display of images on a display panel having pixels, each pixel having a light-emitting device, the method comprising: arranging a camera in front of the display panel; displaying one or more calibration patterns on the display panel while capturing one or more calibration images of said calibration patterns with said camera, said one or more calibration patterns comprising a spaced pattern of coarse features and a spaced pattern of fine features, a spacing of the coarse features larger than a spacing of the fine features; generating a coarse estimate of panel pixel locations within the calibration images from the images of the coarse features in the calibration images; locating images of the fine features within the calibration images with use of the coarse estimate; generating a high-resolution estimate of panel pixel locations within the calibration images from the located images of the fine features in the calibration images, the high-resolution estimate having greater accuracy than the coarse estimate; and generating correction data for correcting images displayed in the display panel with use of the high-resolution estimate.

In some embodiments, the one or more calibration patterns comprises a single calibration pattern, and wherein the once or more calibration images comprises a single image.

In some embodiments, the coarse features are spaced apart from a periphery of the one or more calibration patterns. In some embodiments, the fine features are distributed throughout the one or more calibration patterns. In some embodiments, each fine feature includes pixels of a foreground color, and each coarse feature includes pixels of a foreground color surrounded by an area of a background color, said area absent other coarse features or fine features.

In some embodiments, the coarse estimate comprises a first 2D polynomial function, the high-resolution estimate comprises a second 2D polynomial function, and the second 2D polynomial function has an order greater than an order of the first 2D polynomial function.

In some embodiments, said generating the coarse estimate includes: locating images of the coarse features in the one or more calibration images; identifying the coarse features of the one or more calibration patterns corresponding to said images of the coarse features; and generating a coarse mapping between panel pixel locations and calibration image pixel locations from locations of the images of the coarse features in the one or more calibration images and known locations of the coarse features in the one or more calibration patterns, said locating images of the fine features includes: estimating expected locations of images of the fine features within the one or more calibration images with use of the coarse estimate and known locations of the fine features in the one or more calibration patterns, and said generating the high-resolution estimate includes: identifying the fine features of the one or more calibration patterns corresponding to said images of the fine features; and generating a high-resolution mapping between panel pixel locations and calibration image pixel locations from locations of the images of the fine features in the one or more calibration images and known locations of the fine features in the one or more calibration patterns.

In some embodiments, identifying the fine features of the one or more calibration patterns corresponding to said images of the fine features includes: for each expected location of an image of a fine feature, determining the closest image of a fine feature in the one or more calibrations images which falls within a distance threshold.

In some embodiments, the one or more calibration patterns comprises a single calibration pattern and the once or more calibration images comprises a single image, wherein the coarse features are spaced apart from a periphery of the one or more calibration patterns and include a single pixel of a foreground color surrounded by a square area of a background color, said square area absent other coarse features or fine features, wherein the fine features are distributed throughout the single calibration pattern and each fine feature includes a single pixel of a foreground color, and wherein the coarse estimate comprises a first 2D polynomial function, the high-resolution estimate comprises a second 2D polynomial function, and the second 2D polynomial function has an order greater than an order of the first 2D polynomial function.

In some embodiments, said generating the coarse estimate includes: locating images of the coarse features in the single calibration image; identifying the coarse features of the single calibration pattern corresponding to said images of the coarse features; and generating a coarse mapping between panel pixel locations and calibration image pixel locations from locations of the images of the coarse features in the single calibration image and known locations of the coarse features in the single calibration pattern, said locating images of the fine features includes: estimating expected locations of images of the fine features within the single calibration image with use of the coarse estimate and known locations of the fine features in the single calibration pattern, and said generating the high-resolution estimate includes: for each expected location of an image of a fine feature, determining the closest image of a fine feature in the single calibration image which falls within a distance threshold to identify the fine features of the single calibration pattern corresponding to said images of the fine features; and generating a high-resolution mapping between panel pixel locations and calibration image pixel locations from locations of the images of the fine features in the single calibration image and known locations of the fine features in the single calibration pattern.

According to a second broad aspect there is provided an optical correction system for correcting display of images on a display panel having pixels, each pixel having a light-emitting device, the system comprising: a camera arranged in front of the display panel; an optical processing circuit coupled to said camera adapted to: display one or more calibration patterns on the display panel while capturing one or more calibration images of said calibration patterns with said camera, said one or more calibration patterns comprising a spaced pattern of coarse features and a spaced pattern of fine features, a spacing of the coarse features larger than a spacing of the fine features; generate a coarse estimate of panel pixel locations within the calibration images from the images of the coarse features in the calibration images; locate images of the fine features within the calibration images with use of the coarse estimate; generate a high-resolution estimate of panel pixel locations within the calibration images from the located images of the fine features in the calibration images, the high-resolution estimate having greater accuracy than the coarse estimate; and generate correction data for correcting images displayed in the display panel with use of the high-resolution estimate.

In some embodiments, the optical processing circuit is adapted to generate the coarse estimate by: locating images of the coarse features in the one or more calibration images; identifying the coarse features of the one or more calibration patterns corresponding to said images of the coarse features; and generating a coarse mapping between panel pixel locations and calibration image pixel locations from locations of the images of the coarse features in the one or more calibration images and known locations of the coarse features in the one or more calibration patterns, and the optical processing circuit is adapted to locate images of the fine features by: estimating expected locations of images of the fine features within the one or more calibration images with use of the coarse estimate and known locations of the fine features in the one or more calibration patterns, and the optical processing circuit is adapted to generate the high-resolution estimate by: identifying the fine features of the one or more calibration patterns corresponding to said images of the fine features; and generating a high-resolution mapping between panel pixel locations and calibration image pixel locations from locations of the images of the fine features in the one or more calibration images and known locations of the fine features in the one or more calibration patterns.

In some embodiments, the optical processing circuit is adapted to identify the fine features of the one or more calibration patterns corresponding to said images of the fine features by: for each expected location of an image of a fine feature, determining the closest image of a fine feature in the one or more calibrations images which falls within a distance threshold.

In some embodiments, the optical processing circuit is adapted to generate the coarse estimate by: locating images of the coarse features in the single calibration image; identifying the coarse features of the single calibration pattern corresponding to said images of the coarse features; and generating a coarse mapping between panel pixel locations and calibration image pixel locations from locations of the images of the coarse features in the single calibration image and known locations of the coarse features in the single calibration pattern, the optical processing circuit is adapted to locate images of the fine features by: estimating expected locations of images of the fine features within the single calibration image with use of the coarse estimate and known locations of the fine features in the single calibration pattern, and the optical processing circuit is adapted to generate the high-resolution estimate by: for each expected location of an image of a fine feature, determining the closest image of a fine feature in the single calibration image which falls within a distance threshold to identify the fine features of the single calibration pattern corresponding to said images of the fine features; and generating a high-resolution mapping between panel pixel locations and calibration image pixel locations from locations of the images of the fine features in the single calibration image and known locations of the fine features in the single calibration pattern.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Figure 1:
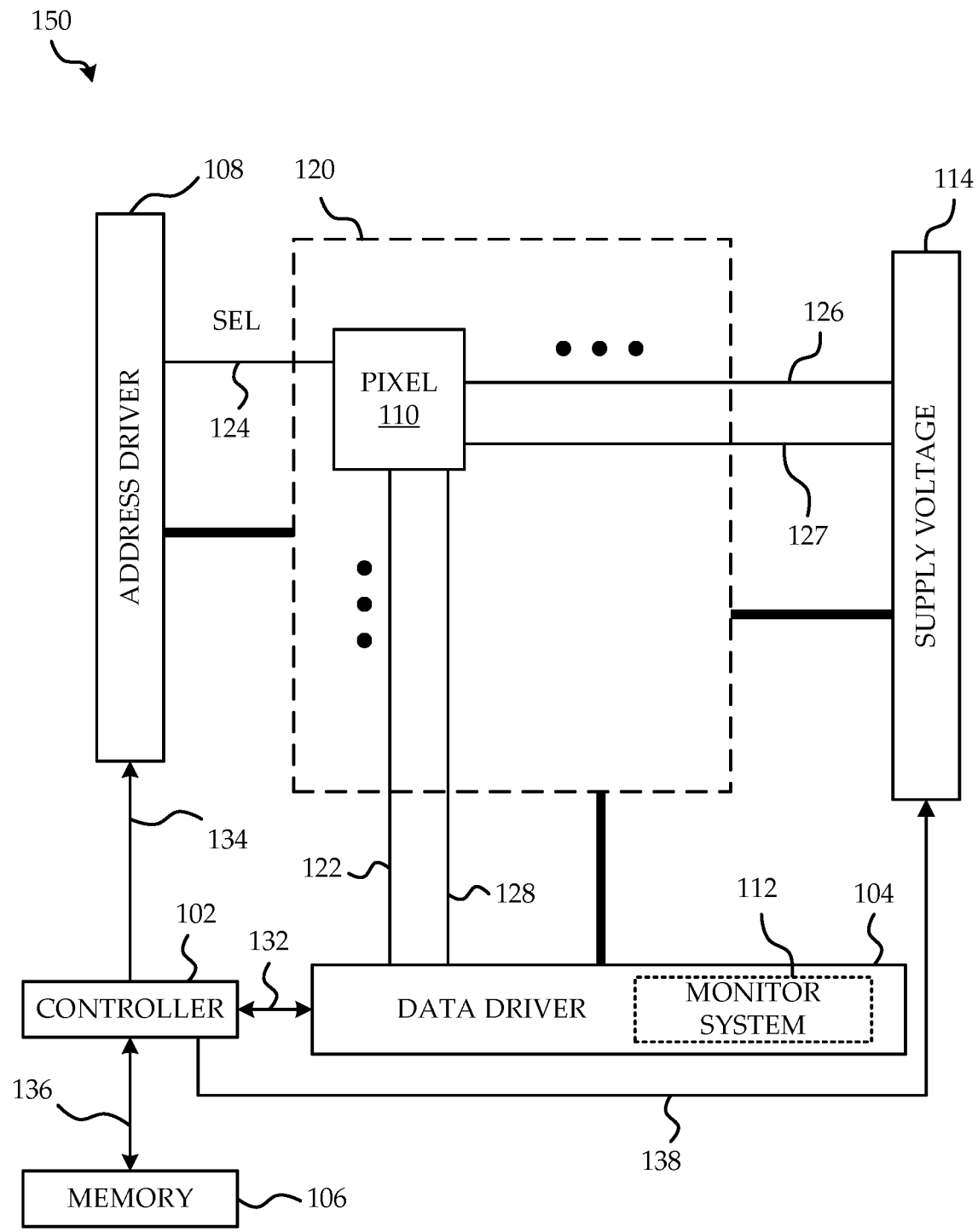
FIG. 1 illustrates an example display system suitable for participation and correction by the optical correction systems and methods disclosed.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

Many modern display technologies suffer from defects, variations, and non-uniformities, from the moment of fabrication, and can suffer further from aging and deterioration over the operational lifetime of the display, which result in the production of images which deviate from those which are intended. Optical correction systems and methods can be used, either during fabrication or after a display has been put into use, to measure and correct pixels (and sub-pixels) whose output luminance varies from the expected luminance. AMOLED panels in particular are characterized by luminance non-uniformity.

To correct for this intrinsic non-uniformity of the display, the incoming video signal is deliberately modified with compensation data or correction data such that it compensates for the non-uniformity. In some approaches, to obtain the correction data the luminance of each individual panel pixel is measured for a range of greyscale luminance values, and correction values for each pixel are determined. A typical optical correction setup utilizes a monochrome or conventional RGB still picture camera as the measurement device. Display test patterns are displayed on the display and captured with the camera. Measurements in the form of captured images are then processed to extract the actual luminance of each individual pixel of the display. Taking into account the greyscale luminance value of the pixel of the display test pattern which was used to drive the pixel of the display, a correction signal for that pixel of the display driven at that greyscale luminance value is determined. Typically, accurate measurement of each pixel's luminance or intensity relies upon an accurate determination of the location of the actual pixels of the panel (panel domain) within the captured images taken by the camera (image domain). Such location information allows unambiguous attribution of intensity measured within various pixels of the captured test images to specific individual pixels of the display panel as its origin. As displays are produced with increasingly higher and higher resolutions this poses a problem for obtaining reliable correction data which rely on high precision identification of the panel pixel locations within captured test images (image domain).

In order to provide precise display panel pixel locations in the image domain for use in processing the various captured images of test patterns displayed on the panel, one or more location calibration patterns specifically suited for determining accurate pixel locations in the image domain are generated, displayed, captured by the camera, and the resulting calibration images are then processed. The calibration patterns include a sparse or coarse distribution of panel features in the panel domain for display and capture, and which enable processing and determination of a coarse functional estimate which maps or estimates every display panel pixel location to corresponding estimated locations within the calibration image, up to a coarse level of accuracy. The first distribution in the panel domain is sufficiently unique and robust such that no specific prior location information is required to identify images of each of these features uniquely in the calibration image domain. The calibration patterns also include a dense or fine distribution of display features for display and capture. This fine distribution need not be as sufficiently unique nor robust as the first distribution, nor sufficiently and uniquely identifiable in the image domain absent any further information. However, each of the display features (in the panel domain) of the second distribution can be sufficiently and uniquely identified in the image domain with use of the coarse functional estimate to approximate the fine features' locations in the image domain. The estimated approximations of the fine features' locations are matched with the nearest detected fine features in the image domain.

The locations of the fine features of the second distribution in the image domain, once matched with coordinates of the same features in the panel domain, are then processed to generate a precise high-resolution functional estimate or mapping of all panel pixel locations in the image domain which is ultimately used in the processing of the captured test images of the various display test patterns. This iterative process may utilize more than two distributions of differing density or granularity, each providing the level of accuracy in feature location estimation to uniquely discern and approximately locate, and then match the features of the next distribution. The various distributions may be embedded in one or more calibration patterns.

It should be understood that since individual panel pixels and features are not one dimensional points but are finite in size, any reference to a "location", "position" or the "coordinates" thereof, is implicitly a reference to a point location, position, or coordinate relative to and associated therewith. In some embodiments, this is taken as the centroid of the panel pixel or feature, while in others, any other well defined and consistently applied relative standard point may be used. It should be understood that references to "positions", "locations", or "coordinates" of pixels or features "in the panel domain" are equivalent to references to actual positions, locations, or coordinates of pixels or features within calibration patterns displayed by the panel. It also should be understood that references to "positions", "locations", or "coordinates" of pixels or features "in the image domain" are equivalent to references to actual "positions", "locations", or "coordinates" of images of pixels or features within the calibration images taken by the camera.

While the embodiments described herein will be in the context of AMOLED displays it should be understood that the optical correction systems and methods described herein are applicable to any other display comprising pixels, including but not limited to light emitting diode displays (LED), electroluminescent displays (ELD), organic light emitting diode displays (OLED), plasma display panels (PSP), microLED or quantum dot displays, among other displays.

It should be understood that the embodiments described herein pertain to systems and methods of optical correction and compensation and do not limit the display technology underlying their operation and the operation of the displays in which they are implemented. The systems and methods described herein are applicable to any number of various types and implementations of various visual display technologies.

FIG. 1 is a diagram of an example display system 150 participating in the methods and systems described further below in conjunction with an arrangement with a camera and optical correction processing. The display system 150 includes a display panel 120, an address driver 108, a data driver 104, a controller 102, and a memory storage 106.

The display panel 120 includes an array of pixels 110 (only one explicitly shown) arranged in rows and columns. Each of the pixels 110 is individually programmable to emit light with individually programmable luminance values. The controller 102 receives digital data indicative of information to be displayed on the display panel 120. The controller 102 sends signals 132 to the data driver 104 and scheduling signals 134 to the address driver 108 to drive the pixels 110 in the display panel 120 to display the information indicated. The plurality of pixels 110 of the display panel 120 thus comprise a display array or display screen adapted to dynamically display information according to the input digital data received by the controller 102. The display screen and various subsets of its pixels define "display areas" which may be used for monitoring and managing display brightness. The display screen can display images and streams of video information from data received by the controller 102. The supply voltage 114 provides a constant power voltage or can serve as an adjustable voltage supply that is controlled by signals from the controller 102. The display system 150 can also incorporate features from a current source or sink (not shown) to provide biasing currents to the pixels 110 in the display panel 120 to thereby decrease programming time for the pixels 110.

For illustrative purposes, only one pixel 110 is explicitly shown in the display system 150 in FIG. 1. It is understood that the display system 150 is implemented with a display screen that includes an array of a plurality of pixels, such as the pixel 110, and that the display screen is not limited to a particular number of rows and columns of pixels. For example, the display system 150 can be implemented with a display screen with a number of rows and columns of pixels commonly available in displays for mobile devices, monitor-based devices, and/or projection-devices. In a multichannel or color display, a number of different types of pixels, each responsible for reproducing color of a particular channel or color such as red, green, or blue, will be present in the display. Pixels of this kind may also be referred to as "subpixels" as a group of them collectively provide a desired color at a particular row and column of the display, which group of subpixels may collectively also be referred to as a "pixel".

The pixel 110 is operated by a driving circuit or pixel circuit that generally includes a driving transistor and a light emitting device. Hereinafter the pixel 110 may refer to the pixel circuit. The light emitting device can optionally be an organic light emitting diode, but implementations of the present disclosure apply to pixel circuits having other electroluminescence devices, including current-driven light emitting devices and those listed above. The driving transistor in the pixel 110 can optionally be an n-type or p-type amorphous silicon thin-film transistor, but implementations of the present disclosure are not limited to pixel circuits having a particular polarity of transistor or only to pixel circuits having thin-film transistors. The pixel circuit 110 can also include a storage capacitor for storing programming information and allowing the pixel circuit 110 to drive the light emitting device after being addressed. Thus, the display panel 120 can be an active matrix display array.

As illustrated in FIG. 1, the pixel 110 illustrated as the top-left pixel in the display panel 120 is coupled to a select line 124, a supply line 126, a data line 122, and a monitor line 128. A read line may also be included for controlling connections to the monitor line. In one implementation, the supply voltage 114 can also provide a second supply line to the pixel 110. For example, each pixel can be coupled to a first supply line 126 charged with Vdd and a second supply line 127 coupled with Vss, and the pixel circuits 110 can be situated between the first and second supply lines to facilitate driving current between the two supply lines during an emission phase of the pixel circuit. It is to be understood that each of the pixels 110 in the pixel array of the display 120 is coupled to appropriate select lines, supply lines, data lines, and monitor lines. It is noted that aspects of the present disclosure apply to pixels having additional connections, such as connections to additional select lines, and to pixels having fewer connections.

With reference to the pixel 110 of the display panel 120, the select line 124 is provided by the address driver 108, and can be utilized to enable, for example, a programming operation of the pixel 110 by activating a switch or transistor to allow the data line 122 to program the pixel 110. The data line 122 conveys programming information from the data driver 104 to the pixel 110. For example, the data line 122 can be utilized to apply a programming voltage or a programming current to the pixel 110 in order to program the pixel 110 to emit a desired amount of luminance. The programming voltage (or programming current) supplied by the data driver 104 via the data line 122 is a voltage (or current) appropriate to cause the pixel 110 to emit light with a desired amount of luminance according to the digital data received by the controller 102. The programming voltage (or programming current) can be applied to the pixel 110 during a programming operation of the pixel 110 so as to charge a storage device within the pixel 110, such as a storage capacitor, thereby enabling the pixel 110 to emit light with the desired amount of luminance during an emission operation following the programming operation. For example, the storage device in the pixel 110 can be charged during a programming operation to apply a voltage to one or more of a gate or a source terminal of the driving transistor during the emission operation, thereby causing the driving transistor to convey the driving current through the light emitting device according to the voltage stored on the storage device.

Generally, in the pixel 110, the driving current that is conveyed through the light emitting device by the driving transistor during the emission operation of the pixel 110 is a current that is supplied by the first supply line 126 and is drained to a second supply line 127. The first supply line 126 and the second supply line 127 are coupled to the voltage supply 114. The first supply line 126 can provide a positive supply voltage (e.g., the voltage commonly referred to in circuit design as "Vdd") and the second supply line 127 can provide a negative supply voltage (e.g., the voltage commonly referred to in circuit design as "Vss"). Implementations of the present disclosure can be realized where one or the other of the supply lines (e.g., the supply line 127) is fixed at a ground voltage or at another reference voltage.

The display system 150 also includes a monitoring system 112. With reference again to the pixel 110 of the display panel 120, the monitor line 128 connects the pixel 110 to the monitoring system 112. The monitoring system 12 can be integrated with the data driver 104, or can be a separate stand-alone system. In particular, the monitoring system 112 can optionally be implemented by monitoring the current and/or voltage of the data line 122 during a monitoring operation of the pixel 110, and the monitor line 128 can be entirely omitted. The monitor line 128 allows the monitoring system 112 to measure a current or voltage associated with the pixel 110 and thereby extract information indicative of a degradation or aging of the pixel 110 or indicative of a temperature of the pixel 110. In some embodiments, display panel 120 includes temperature sensing circuitry devoted to sensing temperature implemented in the pixels 110, while in other embodiments, the pixels 110 comprise circuitry which participates in both sensing temperature and driving the pixels. For example, the monitoring system 112 can extract, via the monitor line 128, a current flowing through the driving transistor within the pixel 110 and thereby determine, based on the measured current and based on the voltages applied to the driving transistor during the measurement, a threshold voltage of the driving transistor or a shift thereof.

The controller and 102 and memory store 106 together or in combination with a compensation block (not shown) use compensation data or correction data, in order to address and correct for the various defects, variations, and non-uniformities, existing at the time of fabrication, and optionally, defects suffered further from aging and deterioration after usage. In some embodiments, the correction data includes data for correcting the luminance of the pixels obtained through measurement and processing using an external optical feedback system such as that described below. Some embodiments employ the monitoring system 112 to characterize the behavior of the pixels and to continue to monitor aging and deterioration as the display ages and to update the correction data to compensate for said aging and deterioration over time.

For the embodiments disclosed herein, correction data is directly determined during an optical correction operation either during or subsequent to fabrication or after the display has been in operation for some time, from observing the luminance of each pixel and determining the correction data to produce luminance of an acceptable level.

It should be understood that the display system 150 is only one example of a display system which may participate in the methods and systems described below.

Figure 2:
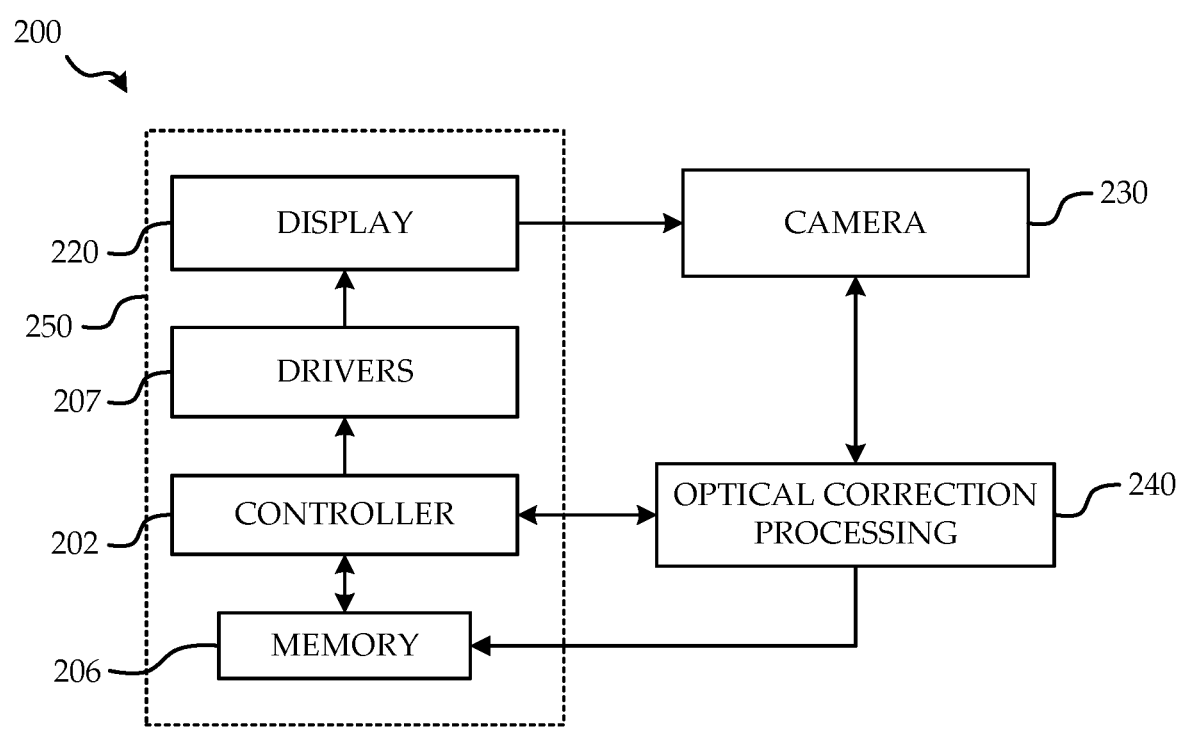
FIG. 2 is a system block diagram of an optical correction system.

Referring to FIG. 2, an optical correction system 200 according to an embodiment will now be described.

The optical correction system 200 includes display system 250 which is to be corrected, a camera 230, a controller 202 for overall control of the process, which in the embodiment of FIG. 2 is shown as part of the display system 250, an optical correction processing module 240 for controlling specific processes of the optical correction methods, and memory storage 206 in the display system 250. The optical correction processing 240 can be part of an external tool that is used for example in a production factory for correction of the displays. In other cases, optical correction processing 240 can be part of the display system and/or the controller, for example, integrated in a timing controller TCON. The display system 250 of FIG. 2 may correspond more or less to the display system 150 of FIG. 1 and includes similar components thereof, of which specifically, drivers 207, the display panel 220, the controller 202, and memory storage 206 are shown explicitly for convenience.

The camera 230 is arranged to measure the luminance of all of the pixels 110 of the display panel 220. The camera 230 may be operated manually or automatically controlled by one or both of the controller 202 and optical correction processing 240. The camera 230 generates a luminance measurement image representative of the optical output of the display panel 220, and the optical correction processing 240 receives the luminance measurement image data from the camera 230. Optical correction processing 240 then processes the measurement image data to generate the correction data which are unique to each display panel 220 and stores it in memory storage 206 for use by the display system 250 in correcting the luminance of the pixels of the display panel 220 when displaying images.

The camera 230 may be based on a digital photography system with lenses, and may be a monochromatic digital camera or a standard digital camera, such as a monochromatic or RGB, CCD CMOS or other sensor array based camera, or any other suitable optical measurement technology capable of taking optical images through a lens. Luminance measurement image data refers to any matrix containing optical luminance data corresponding to the output of the display panel 220, and may comprise multiple channels such as red (R), green (G), blue (B) etc. and in some cases may be monochromatic as in the case where the camera 230 is monochromatic. Hereinafter, luminance measurement image data will be referred to simply as a "captured image" and if monochromatic, will be assumed to include one luminance value for every pixel of the captured image. It should be understood that any reference made to "greyscale luminance value" is a reference to the signal data value used to program and drive a pixel and which results in a pixel producing an actual luminance. For simplicity, the preset luminance values associated with the various pixel patterns described below are characterized in terms of the corresponding greyscale luminance value which is used to program and drive the pixels. Advantages of using a monochromatic camera versus an RGB camera include faster exposure times, avoidance of display and sensor R,G,B frequency mismatch, aliasing, and/or crosstalk, avoidance of mismatching numbers or arrangements of the R,G,B subpixels of the display and the R,G,B elements of the sensor array, and ease of handling yellow or white subpixels of display panel 220. In some embodiments utilizing either a monochromatic or an RGB camera, measurements occur while the display only displays a single channel, primary color, or subpixel color (R, G, B, Y, or W etc.) at any one time.

Figure 3:
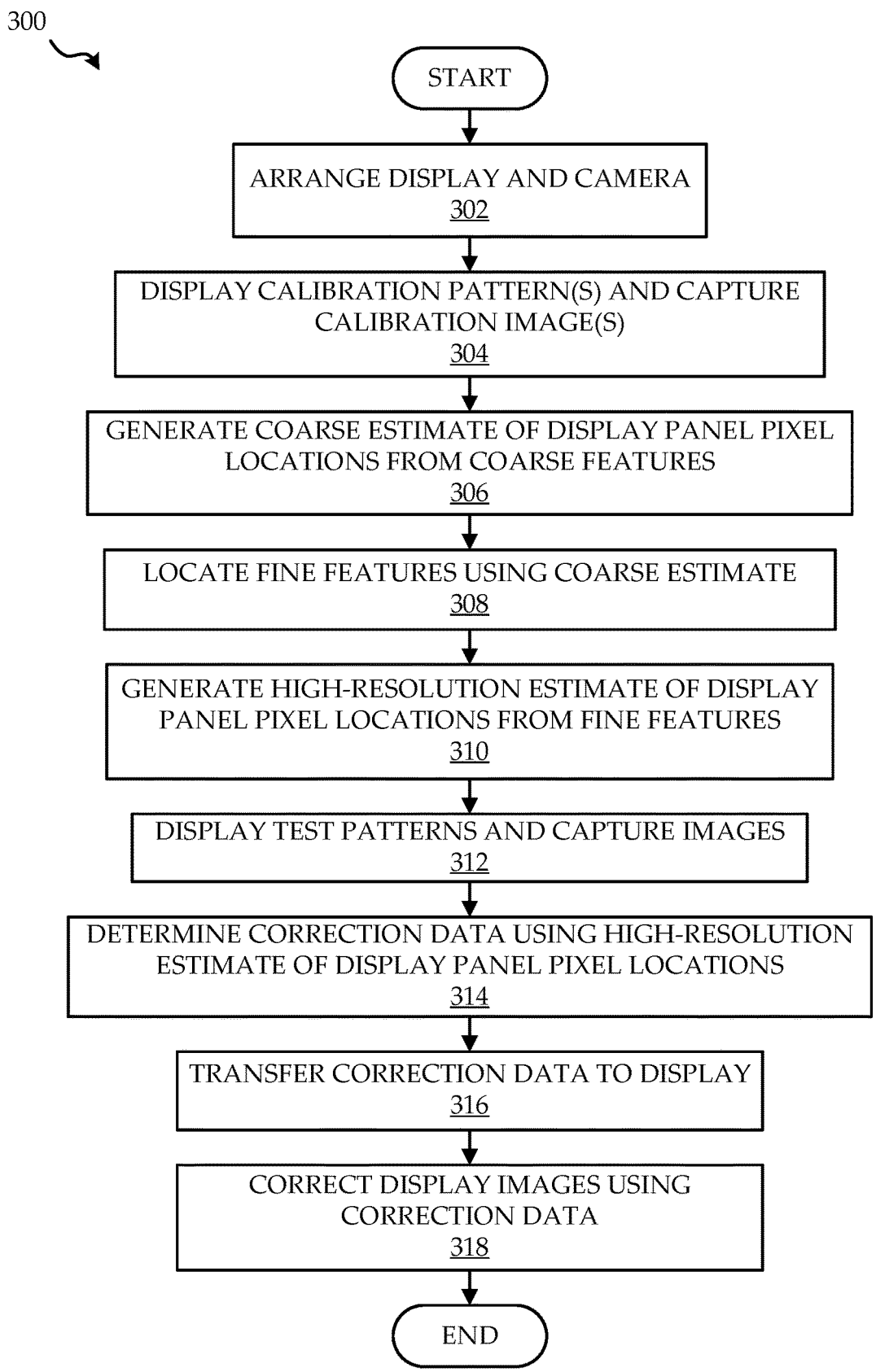
FIG. 3 is a high level functional block diagram of location calibration for an optical correction method.

With reference also to the location calibration for an optical correction method 300 of FIG. 3, the camera 230 is arranged 302 in front of the display panel 220 and one or more calibration patterns are generated or retrieved and provided to the display panel 220 for display, while the camera 230 which has been arranged 302 in front of the display panel 220, captures one or more calibration images of the one or more calibration patterns 304. The camera 230 and the display panel 220 are arranged 302 such that the entirety of the viewable area of the display panel 220 appears within the field of view of the camera 230. In some embodiments, the camera 230 is positioned in front of display panel 220, aimed at the center of the viewable area of the display panel 220 and with the viewable area of the display panel 220 maximized to occupy as much of the field of view of the camera 230 as possible. The line of sight of the camera 230 (controlled by camera pan, tilt, and positioning) may be such that it is parallel and coincident with a normal to the plane of the front surface of the display panel 220 emerging at the center of the display panel 220 to reduce distortions and to ensure any remaining distortions are as symmetrical as possible in the resulting images of the display panel 220.

Figure 4:
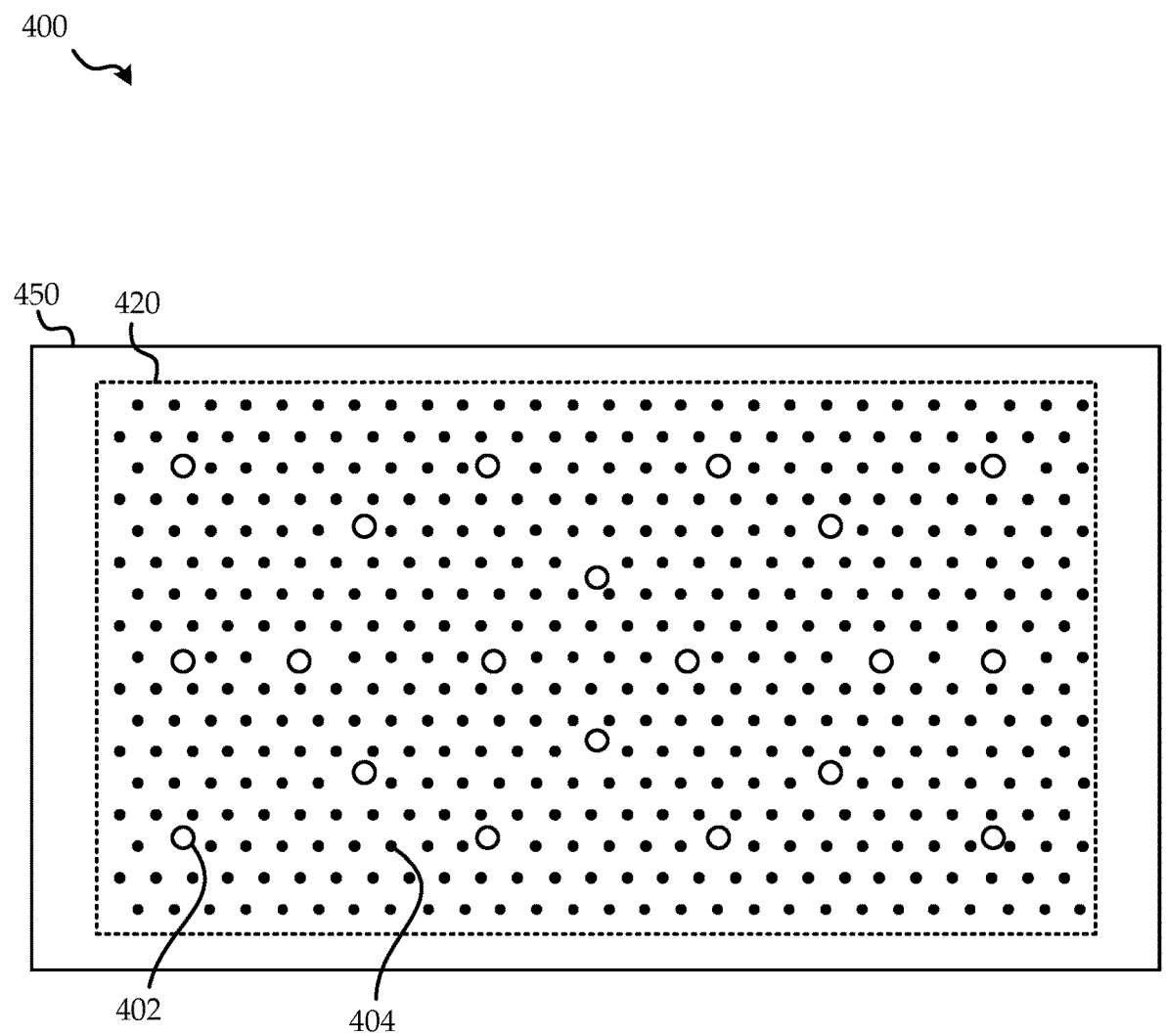
FIG. 4 illustrates a high level example one or more calibration patterns according to an embodiment.

With reference also to the high level example of one or more calibration patterns according to an embodiment 400 of FIG. 4, the display 450 displays on the display panel 420 one or more calibration patterns including a sparse or coarse distribution of display features 402. The sparse or coarse distribution of display features (also referred to herein as coarse features) are relatively widely separated within the one or more calibration patterns and include pixels which are colored with a foreground color or otherwise colored differently from a background color of the calibration pattern. In some embodiments the coarse features 402 include white pixels. In some embodiments the background is black, causing corresponding pixels of the display to remain substantially unlit. The pattern of the coarse features 402 should be robust and unique enough to ensure that occasional flaws in the display panel, such as bad pixels, whether dead, stuck, or otherwise, will not prevent the optical correction processing 240 from finding and correctly and uniquely identifying most of the coarse features 402 in the one or more calibration images (hereinafter "calibration images"). Hereinafter, "identifying" a feature (i.e. an image of a feature) in a calibration image, means to match that feature's image in that calibration image with the actual feature of the calibration pattern.

The coarse features 402 may be arranged in a regular or non-regular pattern and depending on the application and particular display type, may have locations with an average two dimensional density which varies in different areas within the display panel. For flat panel displays with a homogenous density a constant density regular pattern may be used. In some embodiments the coarse features 402 may be arranged in a rectilinear or other regular array. The locations of the coarse features 402 are generally spaced from the periphery of the display panel to avoid potential manufacturing flaws which tend to afflict those areas more than areas closer to the center of the display. Each of the coarse features are visually discernable within the calibration images and since they are generated by specific arrangements of actual pixels within the display panel, they can be processed to determine panel pixel location information, in some cases taking the form of a centroid of a single pixel within with the coarse feature 402. Although represented by small circles in FIG. 4, it is to be understood that the actual pixel arrangements of each coarse feature may take on any form which is sufficiently recognizable within the calibration images and which can be processed for sufficient panel pixel location information accuracy to unambiguously locate fine features within the calibration images (see discussion below). In some embodiments the coarse features include, a single pixel, lines, crosses, filled or hollow circles, squares, or rectangles, or any other shape, and for ease of locating within the calibration images, and to ensure the particular shape is not compromised, may include a surrounding area which is occupied by the background or otherwise absent any other coarse or fine features, and may, for example, impose an interruption in an otherwise homogenous density in the pattern of the fine features.

The coarse features 402 are identified in the calibration images and the image locations of those features within the calibration images along with the known locations of those features within the calibration patterns are used to generate an estimate of the display panel pixel locations 306 within the calibration images. This estimate may take the form of an algorithm, function, matrix, look up table or any other processing which assigns or maps 2D locations of the pixels of the display panel to their estimated 2D locations in the calibration images. Generally speaking, this estimate may be used as a mapping between the locations of actual pixels of the display panel and coarse estimates of their corresponding locations within the calibration images. Due to the inevitable differences in resolution and alignment, the locations of the actual panel pixels generally will not coincide with the locations of the pixels of the calibration image, and hence the estimates for the locations (coarse or otherwise) generally also will not coincide with the locations of the pixels of the calibration image. Position estimates for the panel pixels therefore include subpixel accuracy whether expressed in terms of coordinate positions within the calibration image or on some other normalized scale in each dimension within the calibration image. This coarse estimate generated by the optical correction processing 240, since it is generated from the coarse features provides a low-resolution estimate. Here, low-resolution is not a reference to the numerical or bit-wise precision of the values produced by the estimate, but instead characterizes known limits of its accuracy. In other words, the coarse estimate is low-resolution in that it is known only to be accurate up to a relatively low numerical precision or bit-depth.

The display 450 displays on the display panel 420 calibration patterns also including a dense or fine distribution of display features 404. The dense or fine distribution of display features (also referred to herein as fine features 404) are relatively closely separated within the calibration pattern, being generally spaced apart at an average spacing which is smaller than the average spacing of the coarse features 402. The fine features 404 include pixels which are colored with a foreground color or otherwise colored differently from the background color of the calibration pattern. In some embodiments the fine features 404 include white pixels.

The coarse estimate for the panel pixel locations is then used to locate 308 the fine features 404 of the calibration images. The optical correction processing 240 determines the expected positions within the calibration image of each of the fine features 404 using the coarse estimate and the known locations of the fine features 404 within the calibration patterns, in order to identify images of the fine features 404. Due to the low resolution of the estimate, in some embodiments, the image of a fine feature will often not exactly overlap the expected position of that fine feature. In some embodiments, the closest fine feature image to a particular fine feature's expected position within the calibration image is identified as corresponding to that particular fine feature 404. In some embodiments, if the identified fine feature image is not found within a certain threshold distance from a particular fine feature's expected position, it is discarded. In some embodiments, only a distance from a fine feature's expected position up to the threshold distance is searched, and a fine feature image is identified as corresponding to that fine feature only if that image falls within that distance and is the closest.

The spacing of the pattern of the fine features 404 should be large enough to match the accuracy of the coarse estimate but small enough to provide a high-resolution estimate once processed. Specifically, the spacing should be sufficiently large so that the accuracy of the coarse estimate can correctly and uniquely identify each of the fine features 404 in the calibration images. If the spacing is too small, the coarse estimates of the positions of the fine features 404 risk misidentifying fine features 404 within the calibration images. Given that the amount of available information and the accuracy of the high-resolution estimate once processed increases with the total number of fine features 404 within the calibration images, the spacing is generally chosen to be as small as possible while being sufficiently large for proper identification by the coarse estimate.

The fine features 404 may be arranged in a regular or non-regular pattern and depending on the application and particular display type, may have locations with an average two dimensional density which varies in different areas within the display panel. For flat panel displays with a homogenous density a constant density regular pattern may be used. In some embodiments the fine features 404 may be arranged in a rectilinear or other regular array such as the triangular array depicted in FIG. 4. In some embodiments the fine features 404 are distributed throughout the entire display area. Each of the fine features 404 are visually discernable within the calibration images and since they are generated by specific arrangements of actual pixels within the display panel, they can be processed to determine panel pixel location information, in some cases taking the form of a centroid of a single pixel within with the fine feature 404. Although represented by small dots in FIG. 4, it is to be understood that the actual pixel arrangements of each fine feature 404 may take on any form which is sufficiently recognizable within the calibration images and which can be processed for sufficient panel pixel location information accuracy to generate a high-resolution estimate of the locations of the panel pixels within the calibration images. The fine features generally are small in size, consisting of a relatively small number of pixels, to enable the desired density to produce the high-resolution estimate. In some embodiments, the fine features include, lines, crosses, filled or hollow circles or squares or rectangles, or any other shape, and for ease of locating within the calibration images, and to ensure the particular shape is not compromised, is sufficiently spaced apart from other features, both coarse and fine. In some embodiments, the fine features are single-pixels.

The image locations of the fine features 404 within the calibration images along with the known locations of those features within the calibration patterns are used to generate a high-resolution estimate of the display panel pixel locations 310 within the calibration images. This estimate may take the form of an algorithm, function, matrix, look up table or any other processing which assigns or maps 2D locations of the pixels of the display panel to their estimated 2D locations in the calibration image and may or may not be an estimate similar in kind to the coarse estimate. Generally speaking, this estimate may be used as a mapping between the locations of actual pixels of the display panel and high-resolution estimates of their corresponding locations within the calibration images. High-resolution position estimates for locations of the panel pixels include subpixel accuracy whether expressed in terms of coordinate positions within the calibration image or on some other normalized scale in each dimension within the calibration image. This high-resolution estimate generated by the optical correction processing, since it is generated from the fine features which outnumber the coarse features and which provides more position information than the coarse features, is a more accurate estimate than the coarse estimate. Here, high-resolution is not a reference to the numerical or bit-wise precision of the values produced by the estimate, but instead characterizes known limits of its accuracy. In other words, the high-resolution estimate is high-resolution in that it is known to be accurate up to a relatively high numerical precision or bit-depth.

Once the high-resolution estimate has been generated, optical correction processing 240 can properly process the captured test images containing the luminance measurements used to generate the correction data which will be used to correct images displayed by the display panel. As described above, accurate measurement of each pixel's luminance or intensity relies upon an accurate determination of the locations of the actual pixels of the display within the captured images taken by the camera, and the high-resolution estimate provides this.

Either before, during, or after display and capture of the calibration patterns 304, test patterns are displayed on the display panel and captured by the camera generating test images 312.

The test images are then processed to determine correction data using the high-resolution estimate of the display panel pixel locations previously generated, in order to accurately attribute measured intensities within the test images to the proper panel pixels from which they originate 314. In some embodiments, the test images are processed by using the high-resolution estimates of the panel pixel locations within the test images and an integration window around each of those locations within the test images to calculate the intensity of the panel pixels. This data is processed to calculate the correction data or calibration factors.

In order to correct the display of images displayed by the panel, specifically, in order to create a more uniform display, the correction data or calibration factors are transferred to the memory storage of the display 316, and the display corrects the display image data using the stored correction data 318 to display images which have been corrected and hence exhibit improved uniformity.

In some embodiments where the display only displays a single channel, primary color, or subpixel color (R, G, B, Y, or W etc.) at any one time, the method is performed separately for each channel, primary color, or subpixel color (R, G, B, Y, or W etc.).

It should be understood that this iterative process of using a particular pattern of features of one level of granularity within the calibration patterns to generate one estimate of a particular resolution which is then used to find and identify features of another pattern of features of a finer level of granularity within the calibration patterns to generate another estimate of a higher resolution, is not limited to two levels of granularity and two levels of estimate resolution. In some embodiments any number of two or more levels of granularity, i.e. calibration patterns having two or more kinds of features each arranged in increasingly finer or denser distributions may be used to successively generate estimates of increasingly higher resolution for finding the next successive set of features.

Figure 5:
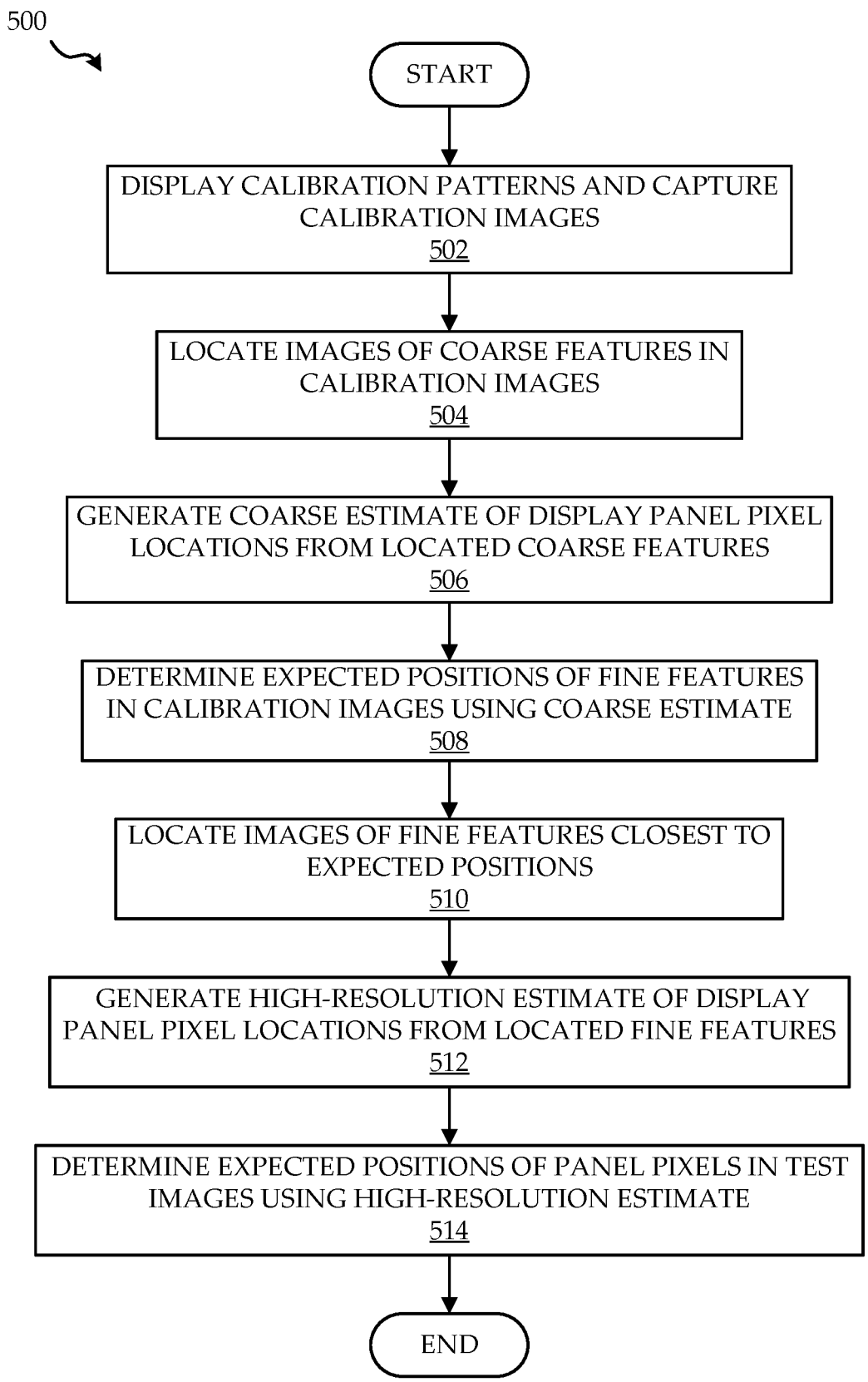
FIG. 5 illustrates a specific example variation of the method illustrated in FIG. 3.

It also should be understood that in some embodiments the one or more calibration patterns is a single calibration pattern including all kinds or granularities of features while in other embodiments the one or more calibration patterns include more than one pattern, preferably each pattern including only one kind or granularity level of feature. Advantageously, in embodiments in which the one or more calibration patterns is a single calibration pattern, time is saved by reducing the number of calibration patterns to be displayed to a single calibration pattern and by reducing the number of calibration images to be captured to a single calibration image With reference also to the specific example variation illustrated in FIG. 5 of the location calibration for an optical correction method 300 of FIG. 3, the camera 230 is arranged in front of the display panel 220 and calibration patterns are generated or retrieved and provided to the display panel 220 for display, while the camera 230 captures calibration images of the calibration patterns 502.

Figure 6:
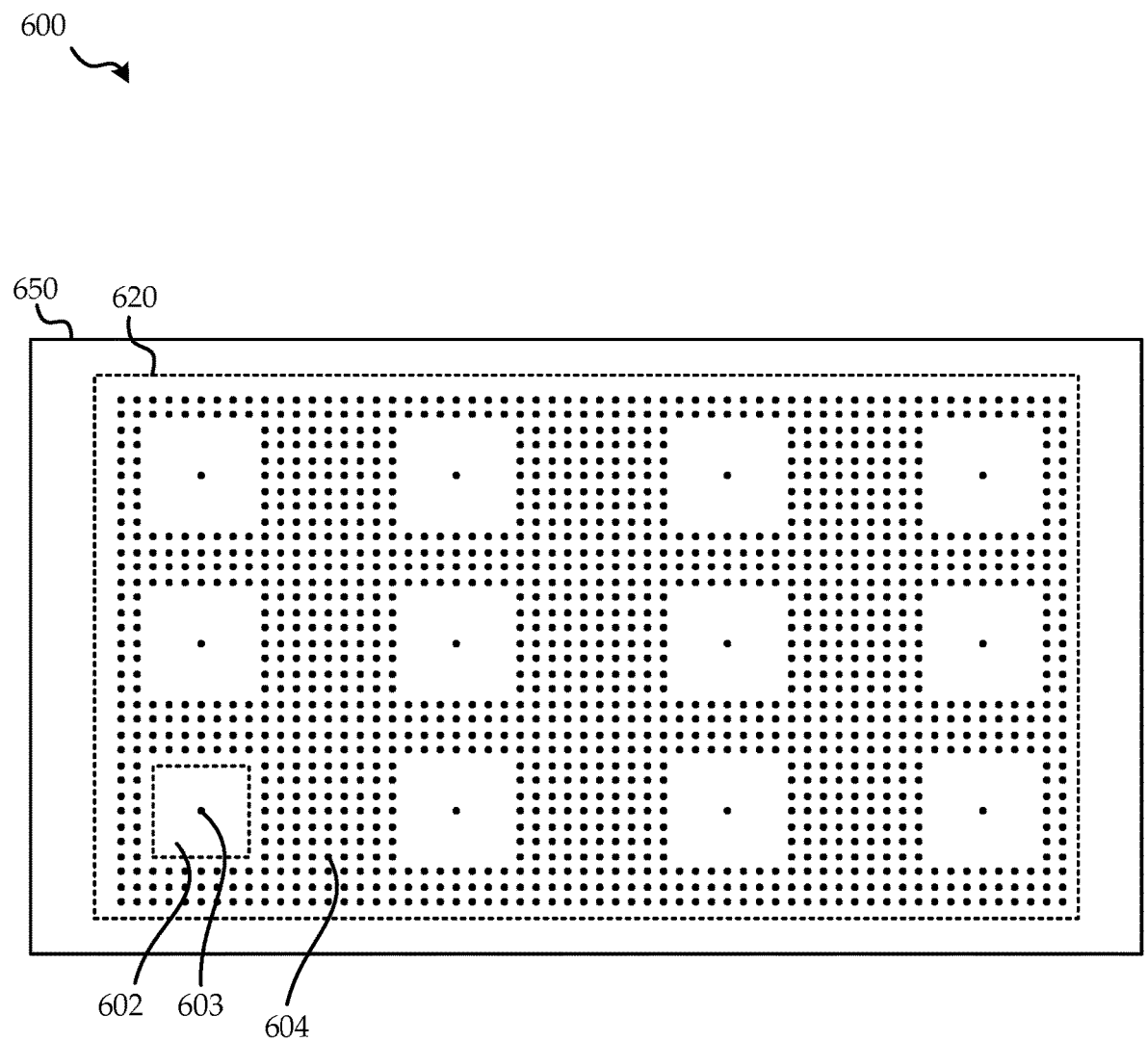
FIG. 6 illustrates a specific example of one or more calibration patterns represented by FIG. 4.

With reference also to the specific example calibration patterns 600 illustrated in FIG. 6, the display 650 displays on the display panel 620 calibration patterns including a sparse or coarse distribution of display features 602. The sparse or coarse distribution of display features (also referred to herein as coarse features) are relatively widely separated within the calibration patterns and include pixels which are colored with a foreground color or otherwise colored differently from a background color of the calibration patterns. In some embodiments, the coarse features 602 include white pixels. In some embodiments, the background is black, causing corresponding pixels of the display to remain substantially unlit. The pattern of the coarse features 602 is robust and unique enough to ensure that occasional flaws in the display panel, such a bad pixels, whether dead, stuck, or otherwise, will not prevent the optical correction processing 240 from finding and correctly and uniquely identifying most of the coarse features 602 in the calibration images.

The coarse features 602 are arranged in a regular rectilinear pattern constituting a distribution of homogeneous density within the display panel. In FIG. 6 a 3×4 array is used for illustration only, generally arrays of other (and often higher) dimensions are used, which are appropriate for the dimensions of the particular display, and for attaining a coarse estimate of the required accuracy to process the fine features. The locations of the coarse features 602 are spaced from the periphery of the display panel to avoid potential manufacturing flaws which tend to afflict those areas more than areas closer to the center of the display. Each of the coarse features 602 are visually discernable within the calibration images to the optical correction processing 240 and since they are generated by specific arrangements of actual pixels within the display panel, they can be processed to determine panel pixel location information. In this embodiment, each coarse feature 602 includes a single pixel 603 surrounded by a square area of unlit or background color pixels, i.e. absent any other coarse or fine features, and can be processed to determine panel pixel location information in the form of a centroid of a single lit or foreground color pixel 603 at the center of each coarse feature 602. These square areas impose an interruption in an otherwise homogenous density in the pattern of the fine features. The size and shape of the square area surrounding the single pixel 603 should be sufficient to meet the requirements of uniqueness, robustness, and being discernable to the optical correction processing 240 mentioned above, and in some embodiments is a square of a dimension multiple times larger than the spacing of the fine features 604. The coarse features in the calibration images are located 504 by optical correction processing 240. In some embodiments, the optical correction processing 240 discerns each coarse feature 602 by finding lit or foreground color pixels in the calibration image which do not have neighbors within some distance below a threshold related to the size of the blank square area (generally about ½ of the length of a side of the square). Those lit or foreground pixels in the calibrated images are determined to be the images of the single pixels 603 of the coarse features 602, and along with the known locations of those features within the calibration patterns, are used to generate a coarse estimate of the display panel pixel locations 506 within the calibration images.

This estimate may take the form of an algorithm, function, matrix, look up table or any other processing which assigns or maps 2D locations of the pixels of the display panel to their estimated 2D locations in the calibration image. This estimate may be used as a mapping between the locations of actual pixels of the display panel and coarse estimates of their corresponding locations within the calibration images. In some embodiments the coarse estimate takes the form a low-order 2-D polynomial. The order of the low-order polynomial depends upon a number of factors but in general it should not be too low or too high. When it is too low inaccuracy increases and the coarse estimate will not be appropriate for the spacing of the fine features 604. When it is too high, anomalies may be introduced or noise in the measurements amplified and so forth. Ideally the order is sufficient for locating the fine features 604 accurately and includes some automatic filtering out of noise. In some embodiments the order of the low-order polynomial is 2. This coarse estimate generated by the optical correction processing 240, since it is generated from the coarse features 602 and is a low-order polynomial provides a low-resolution estimate. Here, low-resolution is not a reference to the numerical or bit-wise precision of the values produced by the estimate, but instead characterizes known limits of its accuracy. In other words, the coarse estimate is low-resolution in that it is known only to be accurate up to a relatively low numerical precision or bit-depth.

The display 650 displays on the display panel 620 calibration patterns also including a dense or fine distribution of display features 604. The dense or fine distribution of display features (also referred to herein as fine features 604) are relatively closely separated within the calibration patterns, being generally spaced apart at an average spacing which is smaller than the average spacing of the coarse features 602. The fine features 604 include pixels which are colored with a foreground color or otherwise colored differently from the background color of the calibration patterns. In some embodiments each fine feature 604 includes a single white pixel.

The coarse estimate for the panel pixel locations is then used to locate the fine features 604 of the calibration images. First, the optical correction processing 240 determines the expected positions within the calibration images of each of the fine features 604 using the coarse estimate 508 and the known locations of the fine features 404 within the calibration patterns, in order to identify images of the fine features 604. Due to the low resolution of the estimate, the image of a fine feature will often not exactly overlap the expected position of that fine feature. Hence, the optical correction processing 240 proceeds to locate the fine feature image closest to each fine feature's expected position 510 within the calibration images to identify it as the fine feature image corresponding to that particular fine feature 604. In some embodiments, if the identified fine feature image is not found within a certain threshold distance from a particular fine feature's expected position, it is discarded. In some embodiments, only a distance from a fine feature's expected position up to the threshold distance is searched, and a fine feature image is identified as corresponding to that fine feature only if that image falls within that distance and is the closest.

The spacing of the pattern of the fine features 604 should be large enough to match the accuracy of the coarse estimate but small enough to provide a high-resolution estimate once processed. Specifically, the spacing should be sufficiently large so that the accuracy of the coarse estimate can correctly and uniquely identify each of the fine features 604 in the calibration images. If the spacing is too small, the coarse estimates of the positions of the fine features 604 risk misidentifying fine features 604 within the calibration images. Given that the amount of available information and the accuracy of the high-resolution estimate once processed increase with the total number of fine features 604 within the calibration images, the spacing is generally chosen to be as small as possible while being sufficiently large for proper identification by the coarse estimate.

The fine features 604 are arranged in a regular rectilinear pattern constituting a distribution of homogeneous density within the display panel and are distributed throughout the entire display area. In FIG. 6, the specific fine array is used for illustration only, generally arrays of any suitable pattern and dimensions are used, which are appropriate for the dimensions of the particular display, and for attaining the high-resolution estimate of the desired accuracy. In some embodiments, a rectangular array of single lit or foreground pixels at every 10th row and column panel pixel position is used. Each of the fine features 604 are visually discernable within the calibration images and since they are generated by specific arrangements of actual pixels within the display panel, they can be processed to determine panel pixel location information. In this embodiment, each fine features 604 are single-pixels. Locations of the images of the fine features 604, located 510 from the expected positions using the coarse estimate, along with the known locations of the fine features 604 within the calibration patterns, are used to generate a high-resolution estimate of the display panel pixel locations 512 within the calibration images.

The high-resolution estimate may take the form of an algorithm, function, matrix, look up table or any other processing which assigns or maps 2D locations of the pixels of the display panel to their estimated 2D locations in the calibration image and may or may not be an estimate similar in kind to the coarse estimate. This estimate may be used as a mapping between the locations of actual pixels of the display panel and high-resolution estimates of their corresponding locations within the calibration images. In some embodiments the high-resolution estimate is a 2D high-order polynomial. The order of the high order polynomial depends upon a number of factors but in general it should not be too low or too high. When it is too low inaccuracy increases and the high-resolution estimate will not be appropriate for accurately determining the positions of the test pixel locations within the test images. When it is too high, anomalies may be introduced or noise in the measurements amplified and so forth. Ideally it is an order sufficient for locating the panel pixel locations in the test images with high accuracy and yet includes some automatic filtering out of noise. In some embodiments the order of the high-order polynomial is 7. High-resolution position estimates for locations of the panel pixels include subpixel accuracy whether expressed in terms of coordinate positions within the calibration image or on some other normalized scale in each dimension within the calibration image. This high-resolution estimate generated by the optical correction processing 512, since it is generated from the fine features which outnumber and are more closely spaced than the coarse features, provides more position information than the coarse features and is a more accurate estimate than the coarse estimate. Here, high-resolution is not a reference to the numerical or bit-wise precision of the values produced by the estimate, but instead characterizes known limits of its accuracy. In other words, the high-resolution estimate is high-resolution in that it is known to be accurate up to a relatively high numerical precision or bit-depth.

Once the high-resolution estimate has been generated, optical correction processing 240 can properly process the captured test images containing the luminance measurements used to generate the correction data which will be used to correct images displayed by the display panel. As described above, accurate measurement of each pixel's luminance or intensity relies upon an accurate determination of the expected locations of the actual pixels of the display panel within the captured images taken by the camera, and the high-resolution estimate provides this 514.

In this embodiment two levels of granularity and two levels of estimate resolution are utilized. In some embodiments the one or more calibration patterns is a single calibration pattern including both the coarse features 602 and fine features 604 as illustrated in FIG. 6. Advantageously, in such embodiments, time is saved by reducing the number of calibration patterns to be displayed to a single calibration pattern and the reducing the number of calibration images to be captured to a single calibration image.

In some embodiments where the display only displays a single channel, primary color, or subpixel color (R, G, B, Y, or W etc.) at any one time, the method is performed separately for each channel, primary color, or subpixel color (R, G, B, Y, or W etc.).

Any of the methods, algorithms, implementations, or procedures described herein can include machine-readable instructions for execution by: (a) a processor, (b) a controller, and/or (c) any other suitable processing device or circuit. Any algorithm, software, or method disclosed herein can be embodied in software stored on a non-transitory tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well-known manner (e.g., it may be implemented by an application specific integrated circuit (ASIC), a programmable logic device (PLD), a field programmable logic device (FPLD), discrete logic, etc.). Also, some or all of the machine-readable instructions represented in process described herein can be implemented manually as opposed to automatically by a controller, processor, or similar computing device or machine. Further, although specific algorithms or processes have been described, persons of ordinary skill in the art will readily appreciate that many other methods of implementing the example machine readable instructions may alternatively be used. For example, the order of execution of some of the steps may be changed, and/or some of the blocks described may be changed, eliminated, or combined.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. An optical correction method for correcting display of images on a display panel having pixels, the method comprising:
displaying one or more calibration patterns on the display panel while capturing one or more calibration images of said calibration patterns, said one or more calibration patterns comprising a pattern of coarse features and a pattern of fine features, an average spatial density of the coarse features less than an average spatial density of the fine features;
locating images of the fine features within the calibration images with use of the images of the coarse features in the calibration images; and
generating correction data for correcting images displayed in the display panel with use of the located images of the fine features.

2. The optical correction method of claim 1, wherein locating images of the fine features within the calibration images with use of the images of the coarse features in the calibration images further comprises:
generating a coarse estimate of panel pixel locations within the calibration images from the images of the coarse features in the calibration images; and
locating images of the fine features within the calibration images with use of the coarse estimate.

3. The optical correction method of claim 2, wherein generating correction data for correcting images displayed in the display panel with use of the located images of the fine features further comprises:
generating a high-resolution estimate of panel pixel locations within the calibration images from the located images of the fine features in the calibration images, the high-resolution estimate having greater accuracy than the coarse estimate; and
generating correction data for correcting images displayed in the display panel with use of the high-resolution estimate.

4. The optical correction method of claim 1, wherein the one or more calibration patterns comprises a single calibration pattern, and wherein the one or more calibration images comprises a single image.

5. The optical correction method of claim 1, wherein the coarse features are spaced apart from a periphery of the one or more calibration patterns.

6. The optical correction method of claim 1, wherein the fine features are distributed throughout the one or more calibration patterns.

7. The optical correction method of claim 1, wherein each fine feature includes pixels of a foreground color, and each coarse feature includes pixels of a foreground color surrounded by an area of a background color, said area absent other coarse features or fine features.

8. The optical correction method of claim 3, wherein the coarse estimate comprises a first 2D polynomial function, the high-resolution estimate comprises a second 2D polynomial function, and the second 2D polynomial function has an order greater than an order of the first 2D polynomial function.

9. The optical correction method of claim 1, wherein the one or more calibration patterns comprises a single calibration pattern and the one or more calibration images comprises a single image, wherein the coarse features are spaced apart from a periphery of the one or more calibration patterns and include a single pixel of a foreground color surrounded by a square area of a background color, said square area absent other coarse features or fine features, wherein the fine features are distributed throughout the single calibration pattern and each fine feature includes a single pixel of a foreground color.

10. The optical correction method of claim 9, wherein locating images of the fine features within the calibration images with use of the images of the coarse features in the calibration images further comprises:
generating a coarse estimate of panel pixel locations within the calibration images from the images of the coarse features in the calibration images, by:
locating images of the coarse features in the single calibration image;
identifying the coarse features of the single calibration pattern corresponding to said images of the coarse features; and
generating a coarse mapping between panel pixel locations and calibration image pixel locations from locations of the images of the coarse features in the single calibration image and known locations of the coarse features in the single calibration pattern; and
locating images of the fine features within the calibration images with use of the coarse estimate, by:
estimating expected locations of images of the fine features within the single calibration image with use of the coarse estimate and known locations of the fine features in the single calibration pattern; and
wherein generating correction data for correcting images displayed in the display panel with use of the located images of the fine features further comprises:
generating a high-resolution estimate of panel pixel locations within the calibration images from the located images of the fine features in the calibration images, the high-resolution estimate having greater accuracy than the coarse estimate, by:
for each expected location of an image of a fine feature, determining the closest image of a fine feature in the single calibration image which falls within a distance threshold to identify the fine features of the single calibration pattern corresponding to said images of the fine features; and
generating a high-resolution mapping between panel pixel locations and calibration image pixel locations from locations of the images of the fine features in the single calibration image and known locations of the fine features in the single calibration pattern; and
generating correction data for correcting images displayed in the display panel with use of the high-resolution estimate.

11. An optical correction system for correcting display of images on a display panel having pixels, the system comprising:
an optical measurement device arranged to optically measure the display panel;
an optical processing circuit coupled to said optical measurement device adapted to
display one or more calibration patterns on the display panel while capturing one or more calibration images of said calibration patterns with said optical measurement device, said one or more calibration patterns comprising a pattern of coarse features and a pattern of fine features, an average spatial density of the coarse features less than an average spatial density of the fine features;
locate images of the fine features within the calibration images with use of the images of the coarse features in the calibration images; and
generate correction data for correcting images displayed in the display panel with use of the located images of the fine features.

12. The optical correction system of claim 11, wherein the optical processing circuit is further adapted to locate images of the fine features within the calibration images with use of the images of the coarse features in the calibration images, by:
generating a coarse estimate of panel pixel locations within the calibration images from the images of the coarse features in the calibration images; and
locating images of the fine features within the calibration images with use of the coarse estimate.

13. The optical correction system of claim 12, wherein the optical processing circuit is further adapted to generate correction data for correcting images displayed in the display panel with use of the located images of the fine features, by:
generating a high-resolution estimate of panel pixel locations within the calibration images from the located images of the fine features in the calibration images, the high-resolution estimate having greater accuracy than the coarse estimate; and
generating correction data for correcting images displayed in the display panel with use of the high-resolution estimate.

14. The optical correction system of claim 11, wherein the one or more calibration patterns comprises a single calibration pattern, and wherein the one or more calibration images comprises a single image.

15. The optical correction system of claim 11, wherein the coarse features are spaced apart from a periphery of the one or more calibration patterns.

16. The optical correction system of claim 11, wherein the fine features are distributed throughout the one or more calibration patterns.

17. The optical correction system of claim 11, wherein each fine feature includes pixels of a foreground color, and each coarse feature includes pixels of a foreground color surrounded by an area of a background color, said area absent other coarse features or fine features.

18. The optical correction system of claim 13, wherein the coarse estimate comprises a first 2D polynomial function, the high-resolution estimate comprises a second 2D polynomial function, and the second 2D polynomial function has an order greater than an order of the first 2D polynomial function.

19. The optical correction system of claim 11, wherein the one or more calibration patterns comprises a single calibration pattern and the one or more calibration images comprises a single image, wherein the coarse features are spaced apart from a periphery of the one or more calibration patterns and include a single pixel of a foreground color surrounded by a square area of a background color, said square area absent other coarse features or fine features, wherein the fine features are distributed throughout the single calibration pattern and each fine feature includes a single pixel of a foreground color.

20. The optical correction system of claim 19, wherein the optical processing circuit is further adapted to:

locate images of the fine features within the calibration images with use of the images of the coarse features in the calibration images by:
  generating a coarse estimate of panel pixel locations within the calibration images from the images of the coarse features in the calibration images, by:
    locating images of the coarse features in the single calibration image;
    identifying the coarse features of the single calibration pattern corresponding to said images of the coarse features; and
    generating a coarse mapping between panel pixel locations and calibration image pixel locations from locations of the images of the coarse features in the single calibration image and known locations of the coarse features in the single calibration pattern; and
  locating images of the fine features within the calibration images with use of the coarse estimate, by:
    estimating expected locations of images of the fine features within the single calibration image with use of the coarse estimate and known locations of the fine features in the single calibration pattern; and generate correction data for correcting images displayed in the display panel with use of the located images of the fine features by:
  generating a high-resolution estimate of panel pixel locations within the calibration images from the located images of the fine features in the calibration images, the high-resolution estimate having greater accuracy than the coarse estimate, by:
    for each expected location of an image of a fine feature, determining the closest image of a fine feature in the single calibration image which falls within a distance threshold to identify the fine features of the single calibration pattern corresponding to said images of the fine features; and
    generating a high-resolution mapping between panel pixel locations and calibration image pixel locations from locations of the images of the fine features in the single calibration image and known locations of the fine features in the single calibration pattern; and
  generating correction data for correcting images displayed in the display panel with use of the high-resolution estimate.

\* \* \* \* \*